(12) United States Patent
Sugaya

(10) Patent No.: US 11,271,306 B2
(45) Date of Patent: Mar. 8, 2022

(54) WIRING BOARD, COUPLER MODULE, AND COMMUNICATION DEVICE

(71) Applicant: Murata Manufacturing Co., Ltd., Nagaokakyo (JP)

(72) Inventor: Yukiteru Sugaya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/882,879

(22) Filed: May 26, 2020

(65) Prior Publication Data

US 2020/0287285 A1 Sep. 10, 2020

Related U.S. Application Data

(63) Continuation of application No. 16/400,106, filed on May 1, 2019, now Pat. No. 10,700,431, which is a (Continued)

(30) Foreign Application Priority Data

Nov. 30, 2016 (JP) .............................. JP2016-233095

(51) Int. Cl.
*H03F 3/24* (2006.01)
*H04B 1/04* (2006.01)
(Continued)

(52) U.S. Cl.
CPC .............. *H01Q 5/50* (2015.01); *H03F 3/245* (2013.01); *H04B 1/00* (2013.01); *H04B 1/04* (2013.01);
(Continued)

(58) Field of Classification Search
CPC .......... H04B 1/00; H04B 1/04; H04B 1/0458; H04B 2001/0408; H04B 1/0057; H04B 1/18; H04B 1/48; H04B 1/40; H04B 1/0064; H04B 7/0413; H04B 7/0689; H04B 1/0053; H04B 17/12; H04B 1/0067;
(Continued)

(56) References Cited

U.S. PATENT DOCUMENTS 6,069,538 A * 5/2000 Nakajima ................ H03H 7/38
333/17.3
7,483,728 B2 * 1/2009 Kobayashi ............. H01Q 1/243
340/572.4
(Continued)

OTHER PUBLICATIONS

Sugaya, "Wiring Board, Coupler Module, and Communication Device", U.S. Appl. No. 16/400,106, filed May 1, 2019.

*Primary Examiner* — Lana N Le
(74) *Attorney, Agent, or Firm* — Keating & Bennett, LLP

(57) ABSTRACT

A wiring board includes couplers and external connection terminals including a first terminal group including a first antenna terminal and a first monitor terminal respectively connected to an output terminal and a coupler terminal of a coupler, and a first spacer terminal between the first antenna terminal and the first monitor terminal, and a second terminal group including a second antenna terminal and a second monitor terminal respectively connected to an output terminal and a coupler terminal of a coupler, and a second spacer terminal between the second antenna terminal and the second monitor terminal.

5 Claims, 7 Drawing Sheets

Related U.S. Application Data continuation of application No. PCT/JP2017/041725, filed on Nov. 20, 2017.

(51) Int. Cl.
| | | |
|---|---|---|
| *H05K 1/11* | (2006.01) | |
| *H04B 1/00* | (2006.01) | |
| *H01Q 5/50* | (2015.01) | |
| *H05K 1/02* | (2006.01) | |
| *H05K 1/18* | (2006.01) | |

(52) U.S. Cl.
CPC .............. *H04B 1/0458* (2013.01); *H05K 1/02* (2013.01); *H05K 1/0243* (2013.01); *H05K 1/11* (2013.01); *H05K 1/181* (2013.01); *H03F 2200/451* (2013.01); *H04B 2001/0408* (2013.01); *H05K 2201/1006* (2013.01)

(58) Field of Classification Search
CPC ...... H04B 1/1615; H04B 7/04; H04B 7/0404; H04B 7/0602; H04B 7/0608; H05K 1/02; H05K 1/11; H05K 1/181; H05K 1/0243; H05K 2201/1006; H05K 1/0246; H05K 1/0237; H05K 1/1116; H05K 1/16; H05K 1/165; H05K 2201/09636; H05K 2201/09672; H05K 3/429; H03F 3/245; H03F 2200/451; H03F 3/72; H03F 2200/111; H03F 2203/7209; H03F 3/19; H01Q 5/50; H01Q 25/00; H01Q 1/243; H01Q 23/00; H01Q 3/34; H01Q 5/00; H01Q 1/523; H01Q 21/24; H01L 2223/6677; H01L 2224/73265

See application file for complete search history.

(56) References Cited

U.S. PATENT DOCUMENTS

| | | | |
|---|---|---|---|
| 7,541,986 B2* | 6/2009 | Park | H01Q 1/243 |
| | | | 343/700 MS |
| 9,419,673 B2* | 8/2016 | Dehos | H01L 25/16 |
| 9,621,210 B1* | 4/2017 | Chang | H03F 3/245 |
| 10,700,431 B2* | 6/2020 | Sugaya | H05K 1/0243 |
| 10,804,953 B2* | 10/2020 | Yeh | H04B 1/18 |
| 2003/0148784 A1* | 8/2003 | Sawamura | H01Q 9/42 |
| | | | 455/550.1 |
| 2004/0203552 A1* | 10/2004 | Horiuchi | H04B 1/005 |
| | | | 455/333 |
| 2004/0240183 A1* | 12/2004 | Ishizaki | H01L 23/3677 |
| | | | 361/719 |
| 2008/0136559 A1* | 6/2008 | Takahashi | H05K 1/165 |
| | | | 333/167 |
| 2010/0182097 A1* | 7/2010 | Hayashi | H04B 1/0458 |
| | | | 333/32 |
| 2010/0225401 A1* | 9/2010 | Hayata | H03F 1/56 |
| | | | 330/295 |
| 2011/0057742 A1* | 3/2011 | Frye | H05K 1/0239 |
| | | | 333/26 |
| 2011/0221519 A1* | 9/2011 | Katoh | H04B 1/0458 |
| | | | 327/558 |
| 2014/0170995 A1* | 6/2014 | Lin | H04B 1/18 |
| | | | 455/83 |
| 2016/0241300 A1* | 8/2016 | Penticoff | H03F 3/245 |
| 2016/0360582 A1* | 12/2016 | Kato | H02M 3/156 |
| 2017/0110779 A1* | 4/2017 | Hanaoka | H04B 1/04 |
| 2019/0140670 A1* | 5/2019 | Hanaoka | H04B 1/0064 |
| 2019/0190563 A1* | 6/2019 | Sakurai | H04B 1/0057 |
| 2020/0058436 A1* | 2/2020 | Nakagawa | H04B 1/50 |
| 2020/0067559 A1* | 2/2020 | Wich | H04B 1/44 |
| 2020/0132012 A1* | 4/2020 | Kuroda | F02M 51/061 |
| 2021/0091796 A1* | 3/2021 | Shinozaki | H04B 1/0053 |

* cited by examiner

WIRING BOARD, COUPLER MODULE, AND COMMUNICATION DEVICE

CROSS REFERENCE TO RELATED APPLICATIONS

This application claims the benefit of priority to Japanese Patent Application No. 2016-233095 filed on Nov. 30, 2016 and is a Continuation Application of PCT Application No. PCT/JP2017/041725 filed on Nov. 20, 2017. The entire contents of each of these applications are hereby incorporated herein by reference.

BACKGROUND OF THE INVENTION

1. Field of the Invention

The present invention relates to a wiring board, a coupler module, and a communication device.

2. Description of the Related Art

In the related art, there is a multi-band high-frequency module in which a diplexer (splitter circuit) is provided in a laminated substrate, together with a switch circuit, a low pass filter circuit, a coupler circuit, and a high-frequency amplifier circuit that are provided for each frequency band (hereinafter simply referred to as a band) (for example, Japanese Unexamined Patent Application Publication No. 2006-191663).

In the high-frequency module, the diplexer combines transmission signals of respective bands into one antenna signal, and splits one antenna signal into reception signals of the respective bands. A plurality of external connection terminals are provided on a mounting surface of the laminated substrate. Included among the plurality of external connection terminals are an antenna terminal Ant that transmits an antenna signal, and monitor terminals CP1 and CP2 that output monitor signals obtained from coupler circuits for the respective bands.

Japanese Unexamined Patent Application Publication No. 2006-191663 discloses an example of an arrangement of the external connection terminals in which one or more terminals including a ground terminal G are disposed between the antenna terminal Ant and the monitor terminal CP1, and between the antenna terminal Ant and the monitor terminal CP2.

In recent years, a technique called carrier aggregation (hereinafter referred to as CA) has been studied in which high-speed and high-capacity radio communication is performed using a plurality of radio waves of different bands simultaneously. In some cases, a high-frequency module for CA is configured to output transmission signals of respective bands individually instead of combining the transmission signals of the respective bands into one signal in the module and transmitting the one signal from an antenna.

Such a high-frequency module may be provided in which, for example, a plurality of antenna terminals that output transmission signals of respective bands individually are provided in place of the antenna terminal Ant in the above-described multi-band high-frequency module.

In the case in which antenna terminals for respective bands are provided, however, there is an issue of how to provide isolation between the individual antenna terminals and other terminals to avoid deterioration of reception sensitivity caused by entry of noise or a harmonic through an antenna. Furthermore, there is concern that an increase in the number of external connection terminals may make it difficult to achieve both a reduction in the size of the module and isolation between terminals.

SUMMARY OF THE INVENTION

Preferred embodiments of the present invention provide coupler modules that each include an antenna terminal and a monitor terminal that are provided for each band and also provide high isolation between terminals. Preferred embodiments of the present invention also provide, wiring boards each including a coupler module according to a preferred embodiment of the present invention, and communication devices each including a coupler module according to a preferred embodiment of the present invention.

A wiring board according to a preferred embodiment of the present invention includes a first coupler; a second coupler; and a plurality of external connection terminals. In the wiring board, each of the first coupler and the second coupler includes an input terminal, which is one end of a main line, an output terminal, which is another end of the main line, and a coupler terminal electromagnetically coupled to the input terminal. Included among the plurality of external connection terminals are a first terminal group including a first antenna terminal connected to the output terminal of the first coupler, a first monitor terminal connected to the coupler terminal of the first coupler, and a first spacer terminal disposed between the first antenna terminal and the first monitor terminal, and a second terminal group including a second antenna terminal connected to the output terminal of the second coupler, a second monitor terminal connected to the coupler terminal of the second coupler, and a second spacer terminal disposed between the second antenna terminal and the second monitor terminal.

In this configuration, the first spacer terminal separates the first antenna terminal and the first monitor terminal, and the second spacer terminal separates the second antenna terminal and the second monitor terminal. For this reason, in each of the first terminal group and the second terminal group, isolation between the antenna terminal and the monitor terminal is provided. When the first terminal group and the second terminal group are used to transmit a signal of a first band and a signal of a second band, the wiring board is able to be obtained that provides, for each band, high isolation between the antenna terminal and the monitor terminal in the band. To improve the isolation effect, the first spacer terminal and the second spacer terminal are not connected to any other circuit in the wiring board, or may be grounded.

Furthermore, the first antenna terminal among the first terminal group may be located closest to the second terminal group, the second antenna terminal among the second terminal group may be located closest to the first terminal group, or the first antenna terminal among the first terminal group may be located closest to the second terminal group and the second antenna terminal among the second terminal group may be located closest to the first terminal group, and a third spacer terminal may be disposed between the first terminal group and the second terminal group.

In this configuration, the third spacer terminal separates the first terminal group and the second terminal group. For this reason, isolation between the first antenna terminal and each of the second antenna terminal and the second monitor terminal, and isolation between the second antenna terminal and each of the first antenna terminal and the first monitor terminal are provided. Thus, the wiring board is able to be obtained that provides high isolation between the antenna terminals for the respective different bands and high isolation between the antenna terminal and the monitor terminal for the respective different bands in addition to the isolation between the antenna terminal and the monitor terminal in the band. To improve the isolation effect, the third spacer terminal is not connected to any other circuit in the wiring board, or may be grounded.

Furthermore, the first monitor terminal among the first terminal group may be located closest to the second terminal group and the second monitor terminal among the second terminal group may be located closest to the first terminal group, and no terminal is disposed between the first terminal group and the second terminal group.

In this configuration, the first monitor terminal separates the first antenna terminal and each terminal of the second terminal group, and the second monitor terminal separates the second antenna terminal and each terminal of the first terminal group. For this reason, isolation between the first antenna terminal and each of the second antenna terminal and the second monitor terminal, and isolation between the second antenna terminal and each of the first antenna terminal and the first monitor terminal are provided. Thus, the wiring board is able to be obtained that provides high isolation between the antenna terminals for the respective different bands and high isolation between the antenna terminal and the monitor terminal for the respective different bands in addition to the isolation between the antenna terminal and the monitor terminal in the band.

The first monitor terminal and the second monitor terminal transmit a weak signal, and thus it is not necessary to achieve isolation in comparison with the antenna terminals, for example. Thus, no terminal is disposed between the first terminal group and the second terminal group, and the first monitor terminal and the second monitor terminal are disposed directly adjacent to each other. This reduces or minimizes the number of external connection terminals and therefore reduces the size of the wiring board.

Furthermore, a coupler module according to a preferred embodiment of the present invention includes the wiring board; and a switch that is mounted on the wiring board and includes a first terminal and a second terminal to transmit signals of respective frequency bands different from each other. The first terminal and the second terminal of the switch are respectively connected to the input terminal of the first coupler and the input terminal of the second coupler. A distance between the first terminal of the switch and the first antenna terminal is shorter than a distance between the first terminal of the switch and the first spacer terminal, and a distance between the second terminal of the switch and the second antenna terminal is shorter than a distance between the second terminal of the switch and the second spacer terminal.

This configuration reduces the distance between the first terminal of the switch and the first antenna terminal and the distance between the second terminal of the switch and the second antenna terminal, each of which is a main path of an antenna signal, and thus reduces the insertion loss of the main path.

Furthermore, a coupler module according to a preferred embodiment of the present invention includes the wiring board; and a switch that is mounted on the wiring board and includes a first terminal and a second terminal to transmit signals of respective bands different from each other. The first terminal and the second terminal of the switch are respectively connected to the input terminal of the first coupler and the input terminal of the second coupler. The first coupler and the second coupler are defined by a wiring conductor provided in or on the wiring board. A first wiring conductor defining a signal path extending from the first terminal of the switch, through the first coupler, to the first antenna terminal, a second wiring conductor defining a signal path extending from the coupler terminal of the first coupler to the first monitor terminal, a third wiring conductor defining a signal path extending from the second terminal of the switch, through the second coupler, to the second antenna terminal, and a fourth wiring conductor defining a signal path extending from the coupler terminal of the second coupler to the second monitor terminal are provided in respective regions that do not overlap one another when the wiring board is viewed in plan view.

In this configuration, the couplers are defined by wiring conductors, thus enabling reductions in size and cost. Furthermore, a path of an antenna signal and a path of a monitor signal do not overlap each other when viewed in plan view, thus improving the isolation between the antenna terminal and the monitor terminal.

Furthermore, the coupler module may further include a filter mounted on the wiring board.

This configuration enables the coupler module to be obtained that includes the filter and provides high isolation between terminals.

Furthermore, the coupler module may further include an amplifier mounted on the wiring board.

This configuration enables the coupler module to be obtained that includes the amplifier and provides high isolation between terminals.

Furthermore, a communication device according to a preferred embodiment of the present invention includes the coupler module; and an RF signal processing circuit to transmit a radio frequency transmission signal to the coupler module.

In this configuration, when the coupler module is used that provides high isolation between terminals, the communication device is able to be obtained that monitors a signal with high accuracy and/or reduces noise greatly.

According to preferred embodiments of the present invention, coupler modules that each include an antenna terminal and a monitor terminal that are provided for each band and also provides high isolation between terminals, wiring boards each including a coupler module according to a preferred embodiment of the present invention, and communication devices each including a coupler module according to a preferred embodiment of the present invention are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
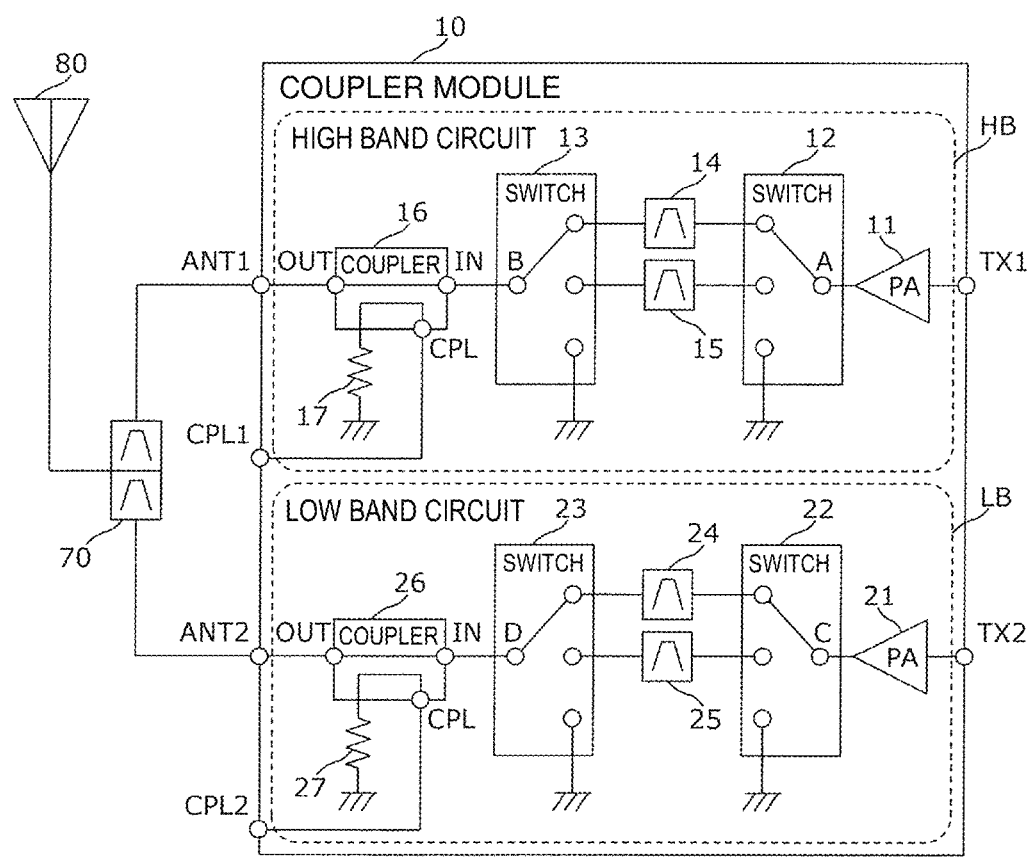
FIG. 1 is a block diagram illustrating an example of a functional configuration of a coupler module according to a first preferred embodiment of the present invention.

Preferred embodiments of the present invention will be described in detail below with reference to the accompanying drawings. Note that all of the preferred embodiments described below describe general or specific examples. Numerical values, shapes, materials, components, the arrangement and connection configuration of the components, and other features and elements that are described in the following preferred embodiments are merely examples and are not intended to limit the scope of the present invention. Among the components in the following preferred embodiments, a component not described in an independent claim is described as an optional component. Furthermore, the size or size ratio of a component illustrated in the drawings is not necessarily exact.

First Preferred Embodiment

A coupler module according to a first preferred embodiment of the present invention is preferably a compound component used in a front-end circuit of a communication device that supports multiple bands (a plurality of frequency bands), for example. The coupler module includes a plurality of signal paths that process radio frequency (RF) signals of band groups different from each other in parallel. Each signal path includes a plurality of signal paths that selectively process a signal of one desired band of a plurality of bands defining a band group, and an RF signal of a desired band is processed by switching between connection and disconnection of the signal paths.

FIG. 1 is a block diagram illustrating an example of a functional configuration of the coupler module according to the first preferred embodiment. As illustrated in FIG. 1, a coupler module 10 includes a high band circuit HB and a low band circuit LB that process signals of two different band groups, and a plurality of external connection terminals. Included among the external connection terminals are a transmission signal terminal TX1, a first antenna terminal ANT1, and a first monitor terminal CPL1 that are provided for a high band, and a transmission signal terminal TX2, a second antenna terminal ANT2, and a second monitor terminal CPL2 that are provided for a low band.

The high band circuit HB includes a power amplifier 11, switches 12 and 13, band pass filters 14 and 15, a coupler 16, and a terminator 17.

The power amplifier 11 amplifies a transmission signal for the high band that has been supplied to the transmission signal terminal TX1, and supplies the transmission signal to a common terminal A of the switch 12. A transmission signal for the high band is a transmission signal of one band selected from among a plurality of bands constituting the high band.

The switches 12 and 13 are preferably defined by, for example, an SP3T (single pole triple throw) switch, and perform switching of a signal path between the common terminal A of the switch 12 and a common terminal B of the switch 13 in accordance with a control voltage, which is not illustrated. Specifically, of the band pass filters 14 and 15, one band pass filter appropriate for a band of a transmission signal is inserted in the signal path, or alternatively the common terminals A and B are grounded when transmission in the high band is not performed.

Here, a structure into which switches 13 and 23 are integrated is an example of a switch, and the common terminal B of the switch 13 and a common terminal D of the switch 23 are respectively examples of a first terminal and a second terminal of the switch.

The coupler 16 includes an input terminal IN, which is one end of a main line, an output terminal OUT, which is the other end of the main line, and a coupler terminal CPL, which is one end of a sub line, electromagnetically coupled to the input terminal IN. The other end of the sub line is terminated by the terminator 17. The coupler 16 transmits a transmission signal of a high band by using the main line and outputs a monitor signal, which is a coupling component of the transmission signal, from the coupler terminal CPL. The terminator 17 may preferably be defined by a resistor, for example.

The first antenna terminal ANT1 and the first monitor terminal CPL1 are respectively connected to the output terminal OUT and the coupler terminal CPL of the coupler 16. The transmission signal and the monitor signal that have been output from the coupler 16 are respectively transmitted to the first antenna terminal ANT1 and the first monitor terminal CPL1.

The low band circuit LB includes a power amplifier 21, switches 22 and 23, band pass filters 24 and 25, a coupler 26, and a terminator 27.

The power amplifier 21 amplifies a transmission signal for the low band that has been supplied to the transmission signal terminal TX2, and supplies the transmission signal to a common terminal C of the switch 22. A transmission signal for the low band is a transmission signal of one band selected from among a plurality of bands defining the low band.

The switches 22 and 23 perform switching of a signal path between the common terminal C of the switch 22 and the common terminal D of the switch 23 in accordance with a control voltage, which is not illustrated. Specifically, of the band pass filters 24 and 25, one band pass filter appropriate for a band of a transmission signal is inserted in the signal path, or alternatively the common terminals C and D are grounded when transmission in the low band is not performed.

The coupler 26 includes an input terminal IN, which is one end of a main line, an output terminal OUT, which is the other end of the main line, and a coupler terminal CPL, which is one end of a sub line, electromagnetically coupled to the input terminal IN. The other end of the sub line is terminated by the terminator 27. The coupler 26 transmits a transmission signal of a low band by using the main line and outputs a monitor signal, which is a coupling component of the transmission signal, from the coupler terminal CPL. The terminator 27 may preferably be defined by a resistor, for example.

The second antenna terminal ANT2 and the second monitor terminal CPL2 are respectively connected to the output terminal OUT and the coupler terminal CPL of the coupler 26. The transmission signal and the monitor signal that have been output from the coupler 26 are respectively transmitted to the second antenna terminal ANT2 and the second monitor terminal CPL2.

The transmission signal of the high band and the transmission signal of the low band that have been respectively transmitted from the first antenna terminal ANT1 and the second antenna terminal ANT2 are combined into one antenna signal by a diplexer 70, and the antenna signal is transmitted from an antenna 80.

A reception circuit is not a component including features of the present invention, and illustration and description thereof are therefore omitted. When a familiar reception circuit is appropriately added to the configuration illustrated in FIG. 1, a coupler module used for both transmission and reception is able to be obtained.

Next, a structure of the coupler module 10, and in particular, the arrangement of external connection terminals and signal paths will be described.

Figure 2:
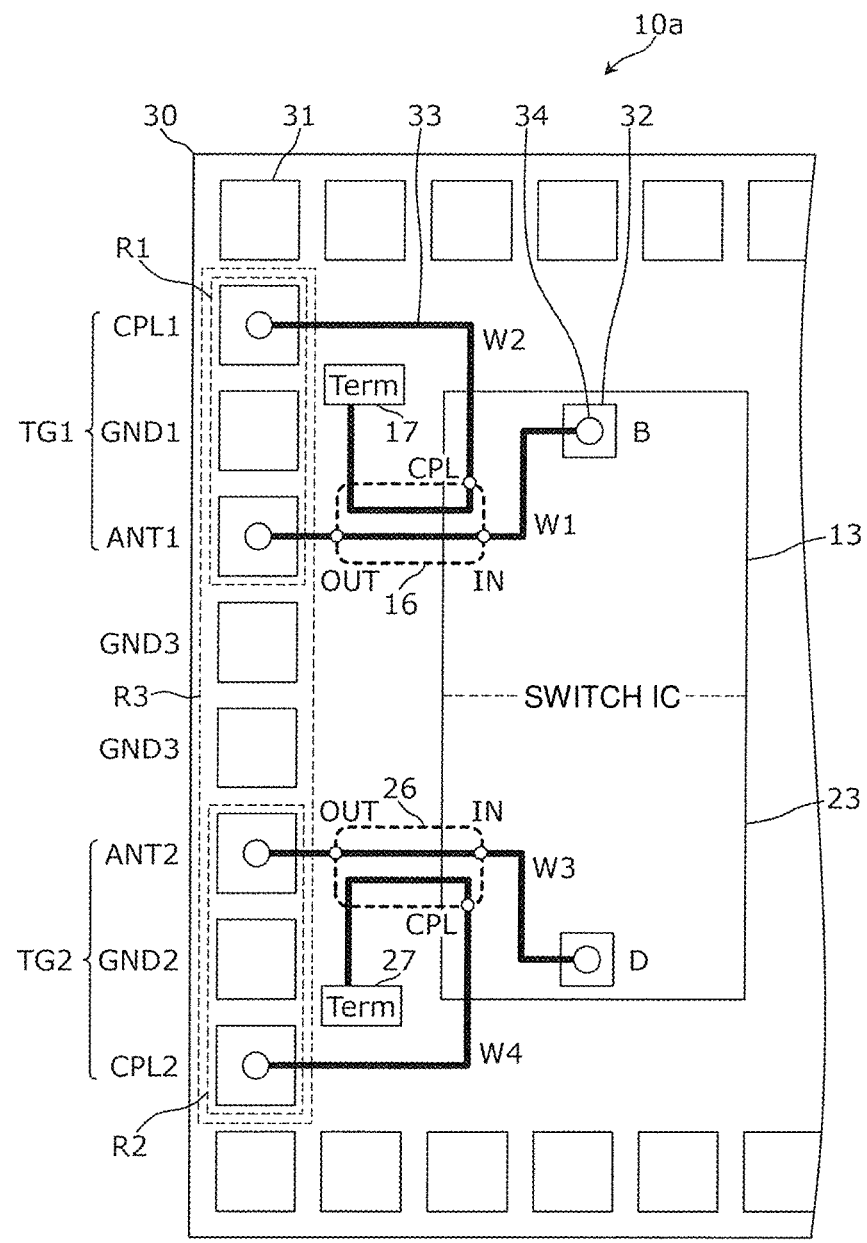
FIG. 2 is a plan view illustrating an example of a structure of a coupler module according to the first preferred embodiment of the present invention.

FIG. 2 is a plan view illustrating a structure of a coupler module 10*a*, which is an example of the coupler module 10. As illustrated in FIG. 2, the coupler module 10*a* includes, in or on a wiring board 30, a switch IC defining and functioning as the switches 13 and 23, the couplers 16 and 26, and the terminators 17 and 27.

The wiring board 30 may preferably be, for example, a double-sided wiring board or a multilayer wiring board made of a resin material, such as phenol or epoxy, or a ceramic material.

In or on the wiring board 30, external connection terminals 31, component mounting terminals 32, wiring conductors 33, and connection vias 34 are provided. In FIG. 2, the external connection terminals 31, the component mounting terminals 32, the wiring conductors 33, and the connection vias 34 are respectively represented by large squares, small squares, thick solid lines, and large circles, and each of the reference numerals denotes only one representative element for the sake of simplicity. The external connection terminals 31, the component mounting terminals 32, the wiring conductors 33, and the connection vias 34 may preferably be made of an electrically conductive material containing copper or silver as a main component, as an example.

The external connection terminals 31 are provided on one main surface of the wiring board 30 and is to be joined to a main board in mounting. The external connection terminals 31 may preferably be, for example, surface electrodes that are exposed at the mounting surface of the wiring board 30. In the example illustrated in FIG. 2, the external connection terminals 31 are disposed on a straight line along an edge of the wiring board 30.

The component mounting terminals 32 are provided on another main surface of the wiring board 30 and on which a component, such as the switch IC, is to be mounted. The component mounting terminals 32 may preferably be, for example, surface electrodes that are exposed at the component mounting surface of the wiring board 30.

The wiring conductors 33 are provided on the one main surface, the other main surface, and a surface of an internal layer of the wiring board 30. The connection vias 34 are provided within the wiring board 30 and connect the external connection terminals 31, the component mounting terminals 32, and the wiring conductors 33 to one another.

Included among the external connection terminals 31 are a first terminal group TG1 for the high band and a second terminal group TG2 for the low band.

The first terminal group TG1 includes the first antenna terminal ANT1, the first monitor terminal CPL1, and a first spacer terminal GND1. The first antenna terminal ANT1 and the first monitor terminal CPL1 are respectively connected to the output terminal OUT and the coupler terminal CPL of the coupler 16. The first spacer terminal GND1 is disposed between the first antenna terminal ANT1 and the first monitor terminal CPL1.

The arrangement of the first spacer terminal GND1 between the first antenna terminal ANT1 and the first monitor terminal CPL1 may indicate that, for example, when the wiring board 30 is viewed in plan view, at least a portion of the first spacer terminal GND1 is located in a minimum rectangle R1 containing the first antenna terminal ANT1 and the first monitor terminal CPL1.

The second terminal group TG2 includes the second antenna terminal ANT2, the second monitor terminal CPL2, and a second spacer terminal GND2. The second antenna terminal ANT2 and the second monitor terminal CPL2 are respectively connected to the output terminal OUT and the coupler terminal CPL of the coupler 26. The second spacer terminal GND2 is disposed between the second antenna terminal ANT2 and the second monitor terminal CPL2.

Here, the arrangement of the second spacer terminal GND2 between the second antenna terminal ANT2 and the second monitor terminal CPL2 may indicate that, for example, when the wiring board 30 is viewed in plan view, at least a portion of the second spacer terminal GND2 is located in a minimum rectangle R2 containing the second antenna terminal ANT2 and the second monitor terminal CPL2.

The first antenna terminal ANT1 among the first terminal group TG1 is located closest to the second terminal group TG2, and the second antenna terminal ANT2 among the second terminal group TG2 is located closest to the first terminal group TG1. Third spacer terminals GND3 are disposed between the first terminal group TG1 and the second terminal group TG2.

Here, the arrangement of the third spacer terminals GND3 between the first terminal group TG1 and the second terminal group TG2 may indicate that, for example, when the wiring board 30 is viewed in plan view, at least a portion of the third spacer terminals GND3 is located in a minimum rectangle R3 containing the first terminal group TG1 and the second terminal group TG2.

In the arrangement of the external connection terminals 31 illustrated in FIG. 2, the first spacer terminal GND1 separates the first antenna terminal ANT1 and the first monitor terminal CPL1. Furthermore, the second spacer terminal GND2 separates the second antenna terminal ANT2 and the second monitor terminal CPL2.

For this reason, in each of the first terminal group TG1 and the second terminal group TG2, isolation between the antenna terminal and the monitor terminal is provided.

Thus, the coupler module 10*a* provides, for each band, high isolation between the antenna terminal and the monitor terminal in the band.

Furthermore, the third spacer terminals GND3 separate the first terminal group TG1 and the second terminal group TG2.

For this reason, isolation between the first antenna terminal ANT1 and each of the second antenna terminal ANT2 and the second monitor terminal CPL2, and isolation between the second antenna terminal ANT2 and each of the first antenna terminal ANT1 and the first monitor terminal CPL1 are provided.

Thus, the coupler module 10*a* provides high isolation between the antenna terminal and the monitor terminal for the respective different bands and high isolation between the antenna terminals for the respective different bands in addition to the isolation between the antenna terminal and the monitor terminal in the band.

To improve the isolation effect, the first spacer terminal GND1, the second spacer terminal GND2, and the third spacer terminals GND3 are not connected to any other circuit in the wiring board 30, or may be grounded.

Furthermore, both of the couplers 16 and 26 may be defined by the wiring conductors 33 provided in or on the wiring board 30. When the couplers 16 and 26 are defined by the wiring conductors 33, the coupler module 10a are able to be reduced in size and cost.

Furthermore, included among the wiring conductors 33 are at least first to fourth wiring conductors W1 to W4.

The first wiring conductor W1 defines a signal path extending from the common terminal B of the switch 13, which is the first terminal of the switch, through the coupler 16, to the first antenna terminal ANT1.

The second wiring conductor W2 defines a signal path extending from the coupler terminal CPL of the coupler 16 to the first monitor terminal CPL1.

The third wiring conductor W3 defines a signal path extending from the common terminal D of the switch 23, which is the second terminal of the switch, through the coupler 26, to the second antenna terminal ANT2.

The fourth wiring conductor W4 defines a signal path extending from the coupler terminal CPL of the coupler 26 to the second monitor terminal CPL2.

The first to fourth wiring conductors W1 to W4 may be provided in respective regions that do not overlap one another when the wiring board 30 is viewed in plan view. When the first wiring conductor W1 and the third wiring conductor W3, each of which is a main path of an antenna signal, and the second wiring conductor W2 and the fourth wiring conductor W4, each of which is a path of a monitor signal, are disposed so that they do not overlap one another when viewed in plan view, the isolation between the antenna terminal and the monitor terminal is able to be further improved.

Note that the arrangement of the external connection terminals 31 is not limited to the example illustrated in FIG. 2, and, for example, the following modifications may be made. That is, the first antenna terminal ANT1, the first spacer terminal GND1, the first monitor terminal CPL1, two third spacer terminals GND3, the second antenna terminal ANT2, the second spacer terminal GND2, and the second monitor terminal CPL2 may be disposed in this order. Furthermore, the first monitor terminal CPL1, the first spacer terminal GND1, the first antenna terminal ANT1, the two third spacer terminals GND3, the second monitor terminal CPL2, the second spacer terminal GND2, and the second antenna terminal ANT2 may be disposed in this order. Furthermore, the number of the third spacer terminals GND3 may be reduced to one.

In all of the arrangements, the first spacer terminal GND1 separates the first antenna terminal ANT1 and the first monitor terminal CPL1. Furthermore, the second spacer terminal GND2 separates the second antenna terminal ANT2 and the second monitor terminal CPL2. Furthermore, the third spacer terminals GND3 separate the first terminal group TG1 and the second terminal group TG2.

Thus, as in the coupler module 10a, a coupler module is able to be obtained that provides high isolation between an antenna terminal and a monitor terminal for respective different bands and high isolation between the antenna terminals for the respective different bands in addition to isolation between the antenna terminal and the monitor terminal in each band.

Second Preferred Embodiment

A coupler module according to a second preferred embodiment of the present invention differs from the coupler module according to the first preferred embodiment in the arrangement of the external connection terminals 31. Hereinafter, a description of matters described in the first preferred embodiment is appropriately omitted, and a description will be provided mainly about matters different from those in the first preferred embodiment.

Figure 3:
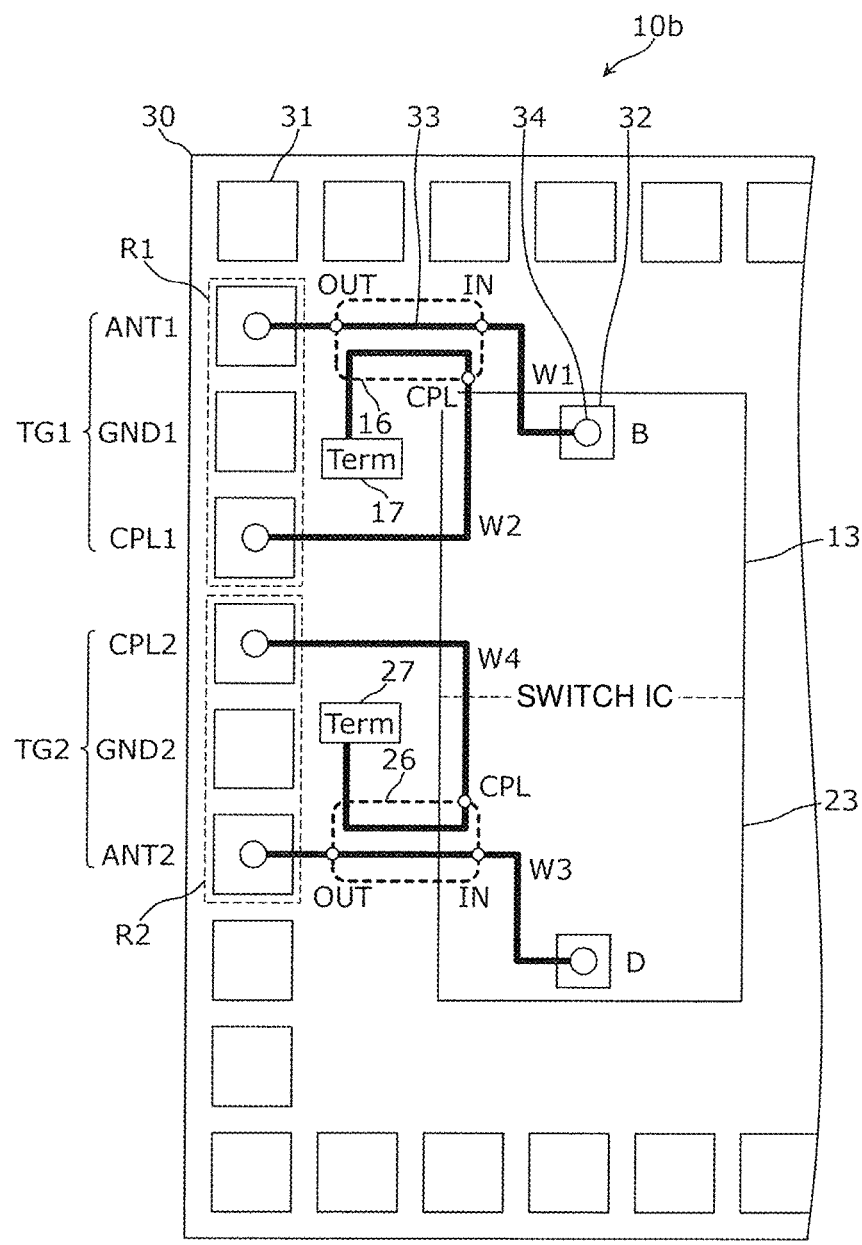
FIG. 3 is a plan view illustrating an example of a structure of a coupler module according to a second preferred embodiment of the present invention.

FIG. 3 is a plan view illustrating a structure of a coupler module 10b according to the second preferred embodiment. As illustrated in FIG. 3, the coupler module 10b differs from the coupler module 10a illustrated in FIG. 2 in the following aspects.

That is, in the coupler module 10b, the first monitor terminal CPL1 among the first terminal group TG1 is located closest to the second terminal group TG2, and the second monitor terminal CPL2 among the second terminal group TG2 is located closest to the first terminal group TG1. Other terminals (for example, the third spacer terminals GND3 in the coupler module 10a) are not disposed between the first terminal group TG1 and the second terminal group TG2.

In the arrangement of the external connection terminals 31 illustrated in FIG. 3, the first monitor terminal CPL1 separates the first antenna terminal ANT1 and each terminal of the second terminal group TG2, and the second monitor terminal CPL2 separates the second antenna terminal ANT2 and each terminal of the first terminal group TG1. For this reason, isolation between the first antenna terminal ANT1 and each of the second monitor terminal CPL2 and the second antenna terminal ANT2, and isolation between the second antenna terminal ANT2 and each of the first monitor terminal CPL1 and the first antenna terminal ANT1 are provided. Thus, the coupler module 10b provides high isolation between the antenna terminals for the respective different bands and high isolation between the antenna terminal and the monitor terminal for the respective different bands in addition to the isolation between the antenna terminal and the monitor terminal in the band.

The first monitor terminal CPL1 and the second monitor terminal CPL2 transmit a weak signal, and thus it is not necessary to achieve isolation in comparison with the first antenna terminal ANT1 and the second antenna terminal ANT2, for example. Thus, no terminal is disposed between the first terminal group TG1 and the second terminal group TG2, and the first monitor terminal CPL1 and the second monitor terminal CPL2 are disposed directly adjacent to each other. This reduces or minimizes the number of the external connection terminals 31 and therefore reduces the size of the coupler module 10b.

Third Preferred Embodiment

A coupler module according to a third preferred embodiment of the present invention differs from the coupler module according to the second preferred embodiment in the arrangement of the external connection terminals 31. Hereinafter, a description of matters described in the first preferred embodiment is appropriately omitted, and a description will be provided mainly about matters different from those in the second preferred embodiment.

Figure 4:
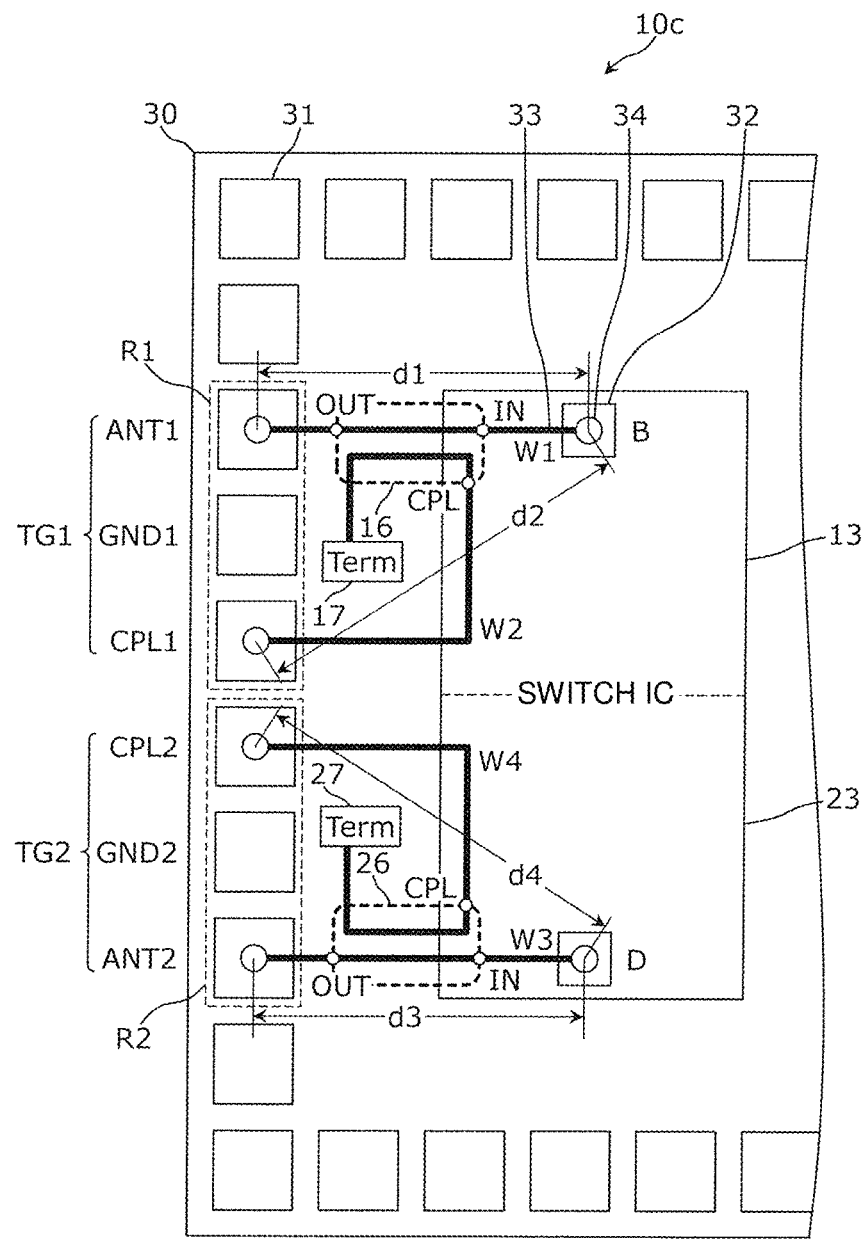
FIG. 4 is a plan view illustrating an example of a structure of a coupler module according to a third preferred embodiment of the present invention.

FIG. 4 is a plan view illustrating a structure of a coupler module 10c according to the third preferred embodiment. As illustrated in FIG. 4, the coupler module 10c differs from the coupler module 10b illustrated in FIG. 3 in the following aspects.

That is, in the coupler module 10c, a distance d1 between the common terminal B of the switch 13, which is the first terminal of the switch, and the first antenna terminal ANT1 is shorter than a distance d2 between the common terminal B and the monitor terminal CPL1. Furthermore, a distance d3 between the common terminal D of the switch 23, which is the second terminal of the switch, and the second antenna terminal ANT2 is shorter than a distance d4 between the common terminal D and the second monitor terminal CPL2. A distance between terminals may be defined as a distance (FIG. 4) between centers of the respective terminals, or may be defined as a distance (not illustrated) between closest points of the respective terminals.

As an example, the common terminal B of the switch 13 and the first antenna terminal ANT1 may be located on a straight line orthogonal or substantially orthogonal to an edge of the wiring board 30, and the common terminal D of the switch 23 and the second antenna terminal ANT2 may be located on a straight line orthogonal or substantially orthogonal to the edge of the wiring board 30.

The arrangement of the external connection terminals 31 illustrated in FIG. 4 reduces extensions of the first wiring conductor W1 and the third wiring conductor W3, each of which is the main path of an antenna signal, and thus reduces the insertion loss of the main path.

In the above description, although the example has been provided in which all of the external connection terminals 31 included in the first terminal group TG1 or the second terminal group TG2 are arranged on a straight line along one edge (a left side in FIGS. 2, 3, and 4) of the wiring board 30, the arrangement of the external connection terminals 31 is not limited to this example.

Figure 5:
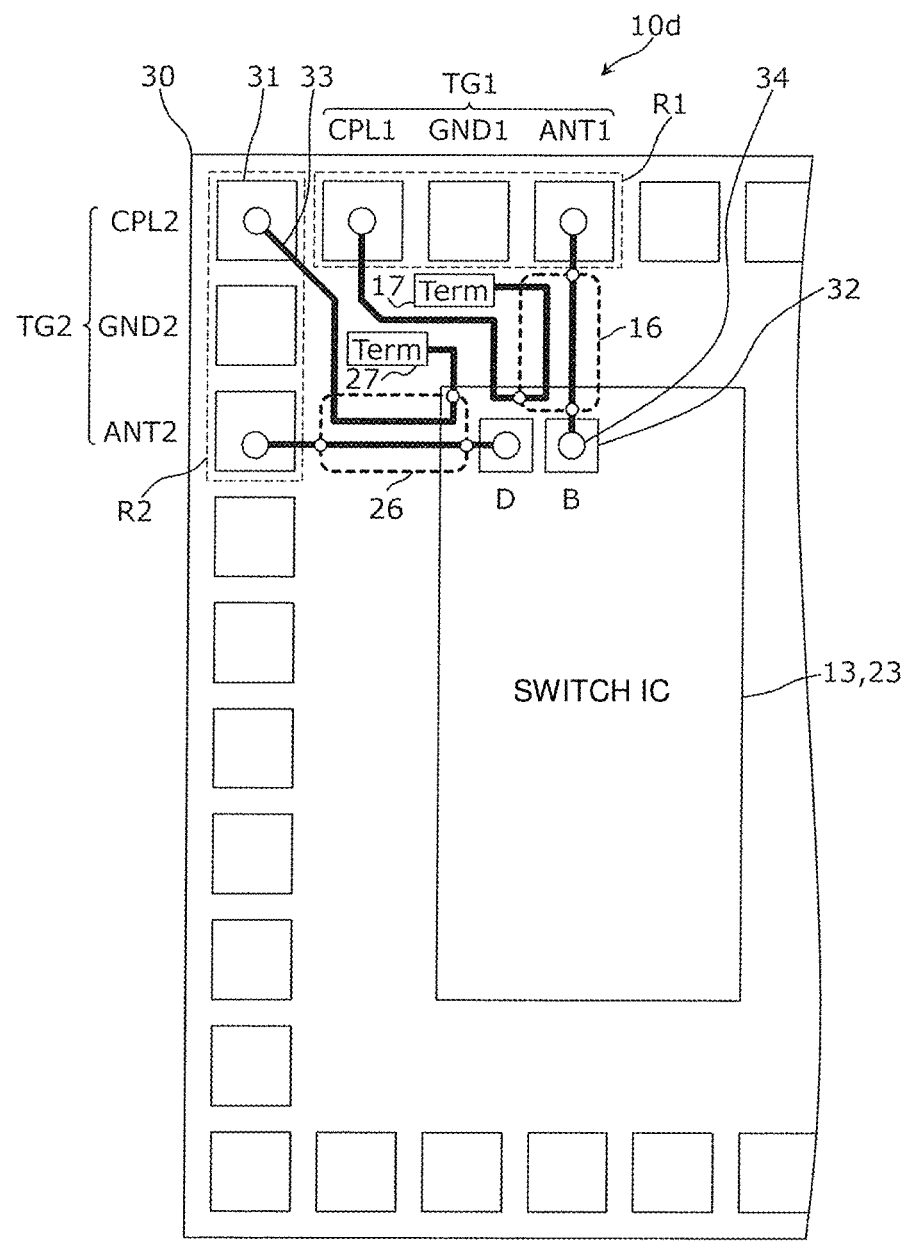
FIG. 5 is a plan view illustrating an example of a structure of a coupler module according to a modification of a preferred embodiment of the present invention.

FIG. 5 is a plan view illustrating a structure of a coupler module 10d according to a modification of a preferred embodiment of the present invention. As illustrated in FIG. 5, in the coupler module 10d, the arrangement of the common terminals B and D of the switches 13 and 23 is changed in comparison with the coupler module 10c illustrated in FIG. 4. In accordance with this change, the first terminal group TG1 and the second terminal group TG2 are disposed in a corner portion at which two edges of the wiring board 30 meet. The external connection terminals 31 included in the first terminal group TG1 are arranged along a first edge (an upper side in FIG. 5). Furthermore, the external connection terminals 31 included in the second terminal group TG2 are arranged along a second edge (a left side in FIG. 5).

The arrangement illustrated in FIG. 5 has the following feature in common with the arrangement illustrated in FIG. 4.

The first monitor terminal CPL1 among the first terminal group TG1 is located closest to the second terminal group TG2, the second monitor terminal CPL2 among the second terminal group TG2 is located closest to the first terminal group TG1, and no terminal is disposed between the first terminal group TG1 and the second terminal group TG2.

Furthermore, a distance between the common terminal B and the first antenna terminal ANT1 is shorter than a distance between the common terminal B and the first spacer terminal GND1, and a distance between the common terminal D and the second antenna terminal ANT2 is shorter than a distance between the common terminal D and the second spacer terminal GND2.

Even in the arrangement of the external connection terminals 31 illustrated in FIG. 5, advantageous effects the same as or similar to those of the coupler module 10c illustrated in FIG. 4 are able to be achieved with the feature in common with the arrangement illustrated in FIG. 4. That is, the coupler module 10d provides high isolation between the antenna terminals for the respective different bands and high isolation between the antenna terminal and the monitor terminal for the respective different bands in addition to the isolation between the antenna terminal and the monitor terminal in the band. Furthermore, the number of the external connection terminals 31 is reduced or minimized and the coupler module 10d is therefore reduced in size.

Figure 6:
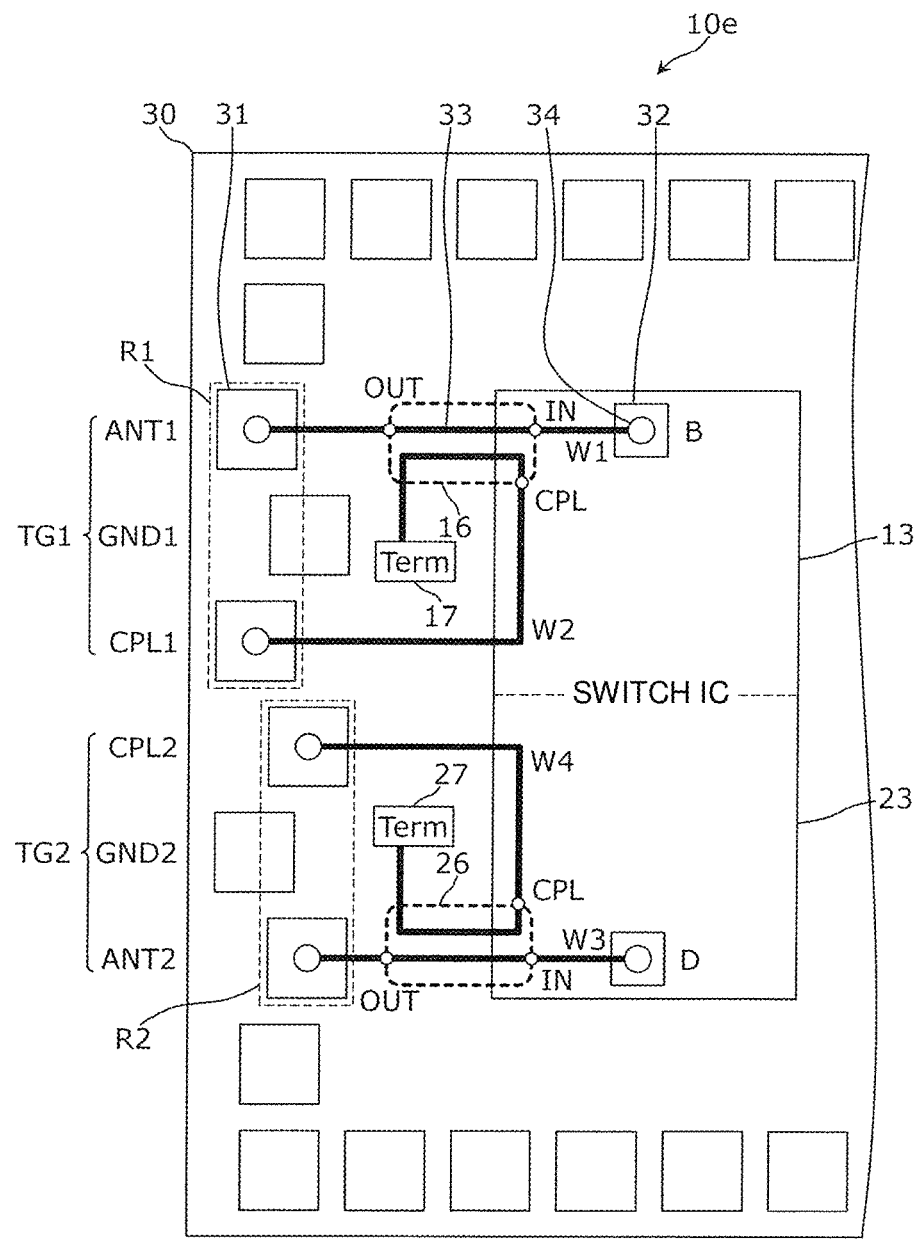
FIG. 6 is a plan view illustrating an example of a structure of a coupler module according to a modification of a preferred embodiment of the present invention.

FIG. 6 is a plan view illustrating a structure of a coupler module 10e according to another modification of a preferred embodiment of the present invention. An arrangement illustrated in FIG. 6 differs from the arrangement illustrated in FIG. 4 only in an arrangement in which, in the first terminal group TG1 and the second terminal group TG2, the external connection terminals 31 are arranged in a zigzag pattern.

Even in the arrangement of the external connection terminals 31 illustrated in FIG. 6, advantageous effects the same as or similar to those of the coupler module 10c illustrated in FIG. 4 are achieved with the feature in common with the arrangement illustrated in FIG. 4. That is, the coupler module 10e provides high isolation between the antenna terminals for the respective different bands and high isolation between the antenna terminal and the monitor terminal for the respective different bands in addition to the isolation between the antenna terminal and the monitor terminal in the band. Furthermore, the number of the external connection terminals 31 is reduced or minimized and the coupler module 10e is therefore reduced in size.

Fourth Preferred Embodiment

In a fourth preferred embodiment of the present invention, communication devices including the coupler modules according to the first to third preferred embodiments and the modifications will be described.

Figure 7:
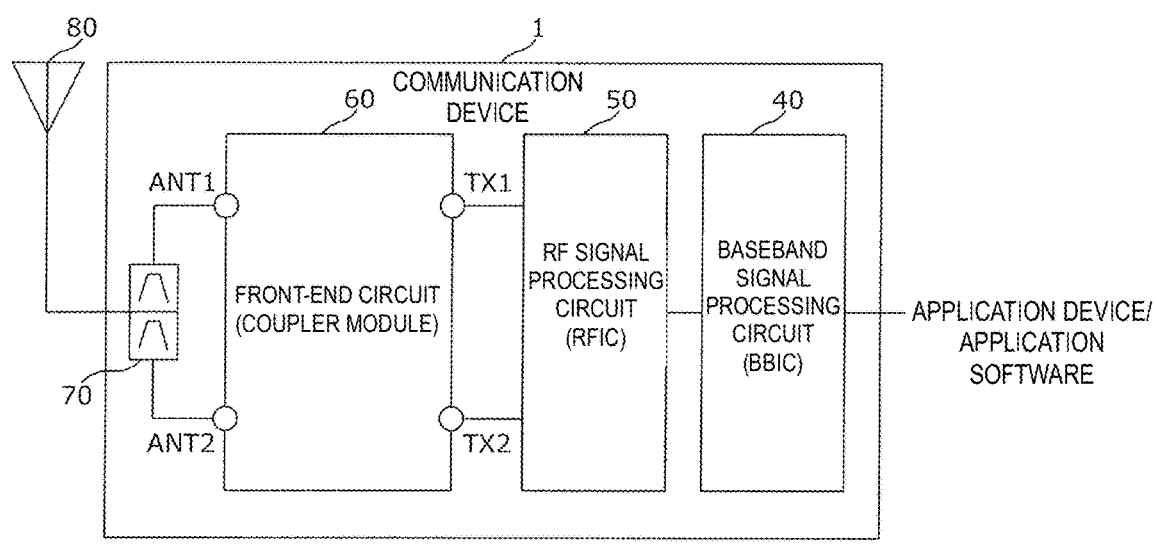
FIG. 7 is a block diagram illustrating an example of a functional configuration of a communication device according to a fourth preferred embodiment of the present invention.

FIG. 7 is a block diagram illustrating an example of a functional configuration of a communication device 1 according to the fourth preferred embodiment. As illustrated in FIG. 7, the communication device 1 includes a baseband signal processing circuit 40, an RF signal processing circuit 50, a front-end circuit 60, and the diplexer 70.

The baseband signal processing circuit 40 converts, into a transmission signal, transmission data generated by an application device/application software that provides a voice call, an image display, and other features, and supplies the transmission signal to the RF signal processing circuit 50. The conversion may include data compression, data multiplexing, and addition of an error correcting code. The baseband signal processing circuit 40 may preferably be defined by, for example, a baseband integrated circuit (BBIC) chip.

The RF signal processing circuit 50 converts the transmission signal generated by the baseband signal processing circuit 40 into a transmission RF signal, and supplies the transmission RF signal to the front-end circuit 60. The conversion may include modulation and up-conversion of a signal, for example. The RF signal processing circuit 50 may preferably be defined by, for example, a radio frequency integrated circuit (RFIC) chip.

The RF signal processing circuit 50 may, for CA, generate transmission RF signals of two bands in parallel and supply the transmission RF signals to the transmission signal terminals TX1 and TX2 of the front-end circuit 60.

The front-end circuit 60 amplifies, using the power amplifiers, the transmission RF signals of the respective bands generated by the RF signal processing circuit 50, and outputs the transmission RF signals to the first antenna terminal ANT1 and the second antenna terminal ANT2 for the respective bands. The front-end circuit 60 is defined by the coupler module 10 according to any of the first to third preferred embodiments and the modifications.

The diplexer 70 combines the transmission RF signals of the respective bands into one antenna signal and supplies the antenna signal to the antenna 80.

When the coupler module 10 according to any of the first to third preferred embodiments and the modifications that provides high isolation between terminals is used as the front-end circuit 60, a communication device is able to be obtained that monitors a signal with high accuracy and/or reduces noise greatly.

A reception circuit is not a component having features of the present invention, and illustration and description thereof are therefore omitted. When a familiar reception circuit is appropriately added to the configuration illustrated in FIG. 7, a communication device used for both transmission and reception is able to be obtained.

Although the coupler modules and the communication devices according to each preferred embodiment of the present invention have been described above, the present invention is not limited to the individual preferred embodiments. Various modifications conceived and made to the present preferred embodiments by a person skilled in the art, or configurations constructed by combining components in different preferred embodiments may also be included in the scope of the present invention as long as they do not depart from the gist of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wiring board comprising:
    a first coupler;
    a second coupler;
    a first switch;
    a second switch; and
    a plurality of external connection terminals; wherein
    each of the first coupler and the second coupler includes an input terminal, which is one end of a main line, an output terminal, which is another end of the main line, and a coupler terminal electromagnetically coupled to the input terminal;
    the input terminal of the first coupler is connected to the first switch;
    the input terminal of the second coupler is connected to the second switch;
    the plurality of external connection terminals include:
    a first terminal group including a first antenna terminal connected to the output terminal of the first coupler, a first monitor terminal connected to the coupler terminal of the first coupler, and a first spacer terminal disposed between the first antenna terminal and the first monitor terminal; and
    a second terminal group including a second antenna terminal connected to the output terminal of the second coupler, a second monitor terminal connected to the coupler terminal of the second coupler, and a second spacer terminal disposed between the second antenna terminal and the second monitor terminal;
    the main line of the first coupler is connected between the first switch and the first antenna terminal; and
    the main line of the second coupler is connected between the second switch and the second antenna terminal.

2. The wiring board according to claim 1, wherein the first antenna terminal of the first terminal group is located closest to the second terminal group, the second antenna terminal of the second terminal group is located closest to the first terminal group, or the first antenna terminal of the first terminal group is located closest to the second terminal group and the second antenna terminal of the second terminal group is located closest to the first terminal group, and a third spacer terminal is disposed between the first terminal group and the second terminal group.

3. The wiring board according to claim 1, wherein the first monitor terminal of the first terminal group is located closest to the second terminal group and the second monitor terminal of the second terminal group is located closest to the first terminal group, and no terminal is disposed between the first terminal group and the second terminal group.

4. A coupler module comprising:
    the wiring board according to claim 1; wherein
    the first switch includes a first terminal and the second switch includes a second terminal to transmit signals of respective frequency bands different from each other;
    the first terminal of the first switch and the second terminal of the second switch are respectively connected to the input terminal of the first coupler and the input terminal of the second coupler;
    a distance between the first terminal of the first switch and the first antenna terminal is shorter than a distance between the first terminal of the first switch and the first spacer terminal; and
    a distance between the second terminal of the second switch and the second antenna terminal is shorter than a distance between the second terminal of the second switch and the second spacer terminal.

5. A coupler module comprising:
    the wiring board according to claim 1; wherein
    the first switch includes a first terminal and the second switch includes a second terminal to transmit signals of respective frequency bands different from each other;
    the first terminal of the first switch and the second terminal of the second switch are respectively connected to the input terminal of the first coupler and the input terminal of the second coupler;
    the first coupler and the second coupler are defined by a wiring conductor provided in or on the wiring board; and
    a first wiring conductor defining a signal path extending from the first terminal of the first switch, through the first coupler, to the first antenna terminal, a second wiring conductor defining a signal path extending from the coupler terminal of the first coupler to the first monitor terminal, a third wiring conductor defining a signal path extending from the second terminal of the second switch, through the second coupler, to the second antenna terminal, and a fourth wiring conductor defining a signal path extending from the coupler terminal of the second coupler to the second monitor terminal are provided in respective regions that do not overlap one another when the wiring board is viewed in plan view.

* * * * *